(12) United States Patent
Lin

(10) Patent No.: US 10,983,545 B2
(45) Date of Patent: Apr. 20, 2021

(54) VOLTAGE CONTROL CIRCUIT AND VOLTAGE CONTROL METHOD

(71) Applicant: Realtek Semiconductor Corp., HsinChu (TW)

(72) Inventor: Chung-Chang Lin, Hsinchu County (TW)

(73) Assignee: Realtek Semiconductor Corp., HsinChu (TW)

(*) Notice: Subject to any disclaimer, the term of this patent is extended or adjusted under 35 U.S.C. 154(b) by 0 days.

(21) Appl. No.: 15/930,448

(22) Filed: May 13, 2020

(65) Prior Publication Data
US 2020/0371537 A1 Nov. 26, 2020

(30) Foreign Application Priority Data
May 23, 2019 (TW) ................... 108117827

(51) Int. Cl.
*H03K 3/03* (2006.01)
*G05F 1/625* (2006.01)
*H03K 21/08* (2006.01)

(52) U.S. Cl.
CPC .......... *G05F 1/625* (2013.01); *H03K 3/0315* (2013.01); *H03K 21/08* (2013.01)

(58) Field of Classification Search
CPC ....... G05F 1/625; H03K 3/0315; H03K 21/08
See application file for complete search history.

(56) References Cited

U.S. PATENT DOCUMENTS

| | | | | |
|---|---|---|---|---|
| 6,023,190 A * | 2/2000 | Wada | ............ | H02M 3/157 323/283 |
| 7,583,555 B2 | 9/2009 | Kang | | |
| 10,763,836 B2 * | 9/2020 | Kuo | ............ | H03K 5/135 |
| 2007/0152739 A1 | 7/2007 | Banerjee | | |
| 2009/0001960 A1 * | 1/2009 | Scotten | ............ | G06F 1/3203 323/318 |
| 2015/0098281 A1 * | 4/2015 | Byeon | ............ | G11C 8/12 365/189.09 |

FOREIGN PATENT DOCUMENTS

TW   201445112 A   12/2014

* cited by examiner

*Primary Examiner* — Dinh T Le
(74) *Attorney, Agent, or Firm* — Winston Hsu

(57) ABSTRACT

A voltage control circuit for controlling an operating voltage of a target circuit, including: a speed detecting circuit, configured to detect an operating speed of the target circuit; and a control circuit, coupled to the speed detecting circuit, configured to generate a voltage control signal according to a difference between the operating speed and a predetermined speed, to a power supply circuit which generates the operating voltage, to control the operating voltage.

19 Claims, 5 Drawing Sheets

VOLTAGE CONTROL CIRCUIT AND VOLTAGE CONTROL METHOD

BACKGROUND OF THE INVENTION

1. Field of the Invention

The present invention relates to a voltage control circuit and a voltage control method, and particularly relates to a voltage control circuit and a voltage control method which can adjust an operating voltage to adjust the operating speed.

2. Description of the Prior Art

In current electronic devices, ICs (Integrated Circuits) are quite popular and important parts that provide various required functions. However, after the mass production of ICs, there are usually different degrees of process variation between different IC cells, and the actual operating temperature, operating voltage, package characteristics, characteristics of the carrier circuit board and the external components to which the carrier circuit board connected may also vary. Therefore, the maximum operating speed (for example, the maximum clock rate of an IC) that each IC can achieve and the most suitable operating condition for each IC will vary.

At present, when the internal clock of the IC has a fixed frequency or a specific clock frequency group in a frequency conversion system, the supply voltage is always fixed. Such situation may cause some problems.

For example, if the IC has a faster operating speed than expected, that is, only a lower operating voltage is required to have the expected operating speed, in such case the above-mentioned fixed supply voltage given to the IC may cause excessive power consumption. Conversely, if the IC has a slower operating speed than expected, that is, a higher operating voltage is required to have the expected operating speed, in such case the above-mentioned fixed supply voltage may give the IC an operating voltage which is too low. Such operating voltage affects the stability of its operation, or the IC is eliminated during the mass production test phase, which affects the yield of the IC.

SUMMARY OF THE INVENTION

Therefore, one objective of the present invention is to provide a voltage control circuit and a voltage control method, which can automatically adjust the operating voltage corresponding to different IC characteristics, to solve the conventional issue.

Another objective of the present invention is to provide an IC, which can automatically adjust the operating voltage thereof corresponding to different IC characteristics, to solve the conventional issue.

One embodiment of the present invention discloses a voltage control circuit, for controlling an operating voltage of a target circuit, comprising: a speed detecting circuit, configured to detect an operating speed of the target circuit; and a control circuit, coupled to the speed detecting circuit, configured to generate a voltage control signal according to a difference between the operating speed and a predetermined speed, to a power supply circuit which generates the operating voltage, to control the operating voltage.

Another embodiment of the present invention discloses a voltage control method, for controlling an operating voltage of a target circuit, comprising: (a) using a speed detecting circuit to receive a test signal from the target circuit, and to calculate an operating speed of the target circuit according to the test signal; and (b) generating a voltage control signal according to a difference between the operating speed and a predetermined speed, to a power supply circuit which generates the operating voltage, to control the operating voltage.

Still another embodiment of the present invention discloses an IC capable of automatically adjusting an operating voltage, comprising: an internal circuit, receiving an operating voltage; a speed detecting circuit, coupled to the internal circuit, configured to detect an operating speed of the target circuit; and a control circuit, coupled to the speed detecting circuit, configured to generate a voltage control signal according to a difference between the operating speed and a predetermined speed, to a power supply circuit which generates the operating voltage, to control the operating voltage.

In view of above-mentioned embodiments, the operating voltage can be automatically adjusted to maintain the operating speed of the target circuit at a predetermined speed. By this way, the issue for the prior art, that is, a too high operating voltage causes power consumption and a too low operating voltage affect the stability of the IC operation or yield can be avoided.

These and other objectives of the present invention will no doubt become obvious to those of ordinary skill in the art after reading the following detailed description of the preferred embodiment that is illustrated in the various figures and drawings.

DETAILED DESCRIPTION

In following descriptions, different embodiments are provided to explain the concept of the present invention. Please note, the terms "first", "second" . . . and the like are only for identifying different components and steps, but do not mean to limit sequences thereof.

Figure 1:
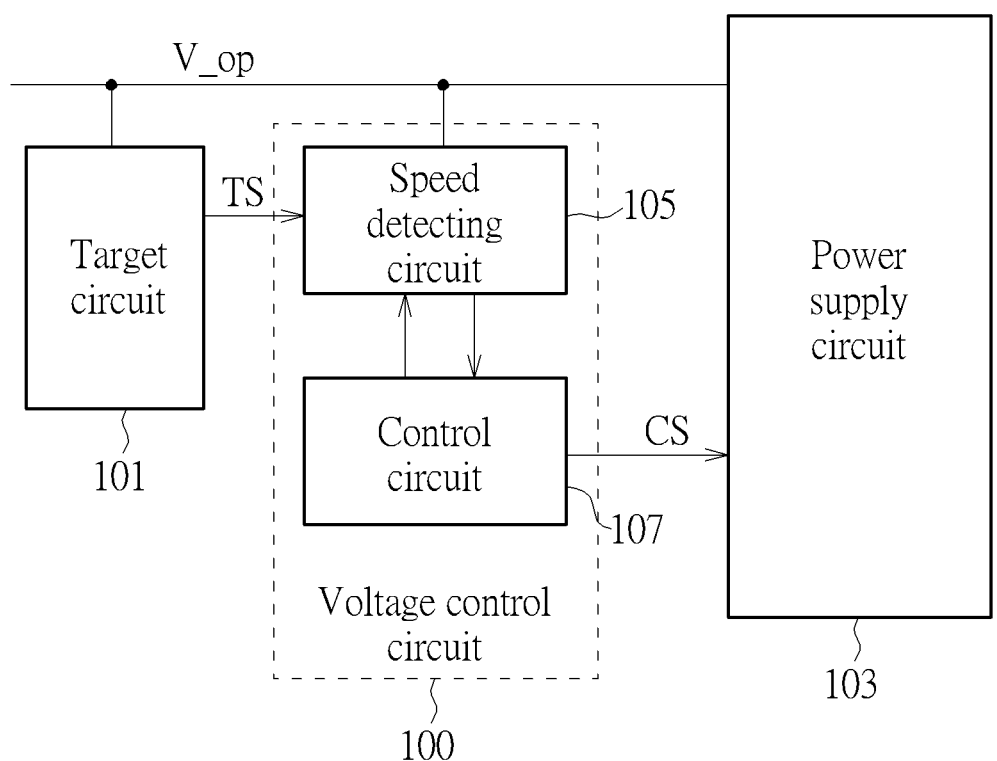
FIG. 1 is a block diagram illustrating a voltage control circuit according to one embodiment of the present invention.

FIG. 1 is a block diagram illustrating a voltage control circuit 100 according to one embodiment of the present invention. As shown in FIG. 1, the voltage control circuit 100 is coupled to a target circuit 101 and a power supply circuit 103 configured to generate an operating voltage V_op to the target circuit 101. The voltage control circuit 100 comprises a speed detecting circuit 105 and a control circuit 107. The speed detecting circuit 105 can receive a test signal TS from the target circuit 101 and calculate an operating speed (for example, the clock rate) of the target circuit based on the test signal TS. In one embodiment, the test signal TS is a clock signal corresponding to the operating speed of the target circuit 101. The faster the operating speed, the smaller the signal period of the test signal TS (that is, the higher the frequency thereof). The control circuit 107 is coupled to the speed detecting circuit 105 for generating a voltage control signal CS to the power supply circuit 103 according to the difference between the operating speed and a predetermined speed, to control the operating voltage V_op. In one embodiment, if the operating speed is higher than the predetermined speed, the operating voltage V_op is decreased to correspondingly reduce the operating speed. Conversely, if the operating speed is lower than the predetermined speed, the operating voltage V_op is pulled up to increase the corresponding operating speed.

In one embodiment, the power supply circuit 103 comprises at least one transistor, such as an NMOSFET (N-channel Metal-Oxide-Semiconductor Field-Effect Transistor), PMOSFET (P-channel Metal-Oxide-Semiconductor Field-Effect Transistor) or a BJT (bipolar junction transistor). The voltage control signal CS is an analog signal or a digital signal for controlling the transistor. In another embodiment, the voltage control signal CS is a digital signal with at least one digit code, and the different digital codes represent different voltages. For example, when the voltage control signal CS is 10001, the operating voltage V_op is 3.3v, and when the voltage control signal CS is 10111, the operating voltage V_op is 5v. However, the voltage control signal CS is not limited to these examples.

Figure 2:
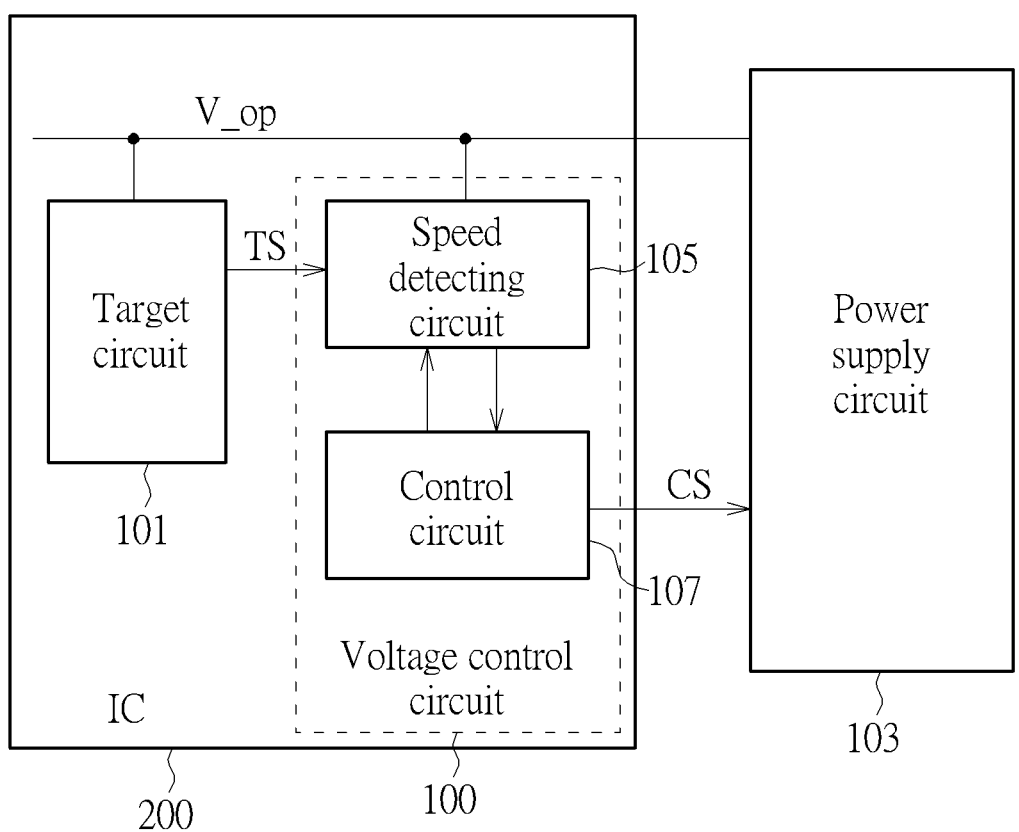
FIG. 2 is a block diagram illustrating a voltage control circuit according to another embodiment of the present invention.

The voltage control circuit 100 and the target circuit 101 can be located in the same IC but can be located in different ICs as well. FIG. 2 is a block diagram illustrating a voltage control circuit according to another embodiment of the present invention. As shown in FIG. 2, the voltage control circuit 100 and the target circuit 101 are located in the same IC 200, and the target circuit 101 is an internal circuit in the IC 200. The internal circuit means a circuit which is in the IC 200 and can provide a desired function, which can be coupled to the pin of the IC 200 through an I/O circuit. Such internal circuit can also be named as a core device or a core circuit. In such embodiment, the power supply circuit 103 can also be comprised in the IC 200 and can be a circuit independent from the IC 200 (e.g. an independent power supply IC). In one embodiment, if the speed detecting circuit 105 and the target circuit 101 are in the same IC, the speed detecting circuit 105 can detect the IC speed by itself, and the target circuit 101 may not output the test signal TS to the speed detecting circuit 105.

Figure 3:
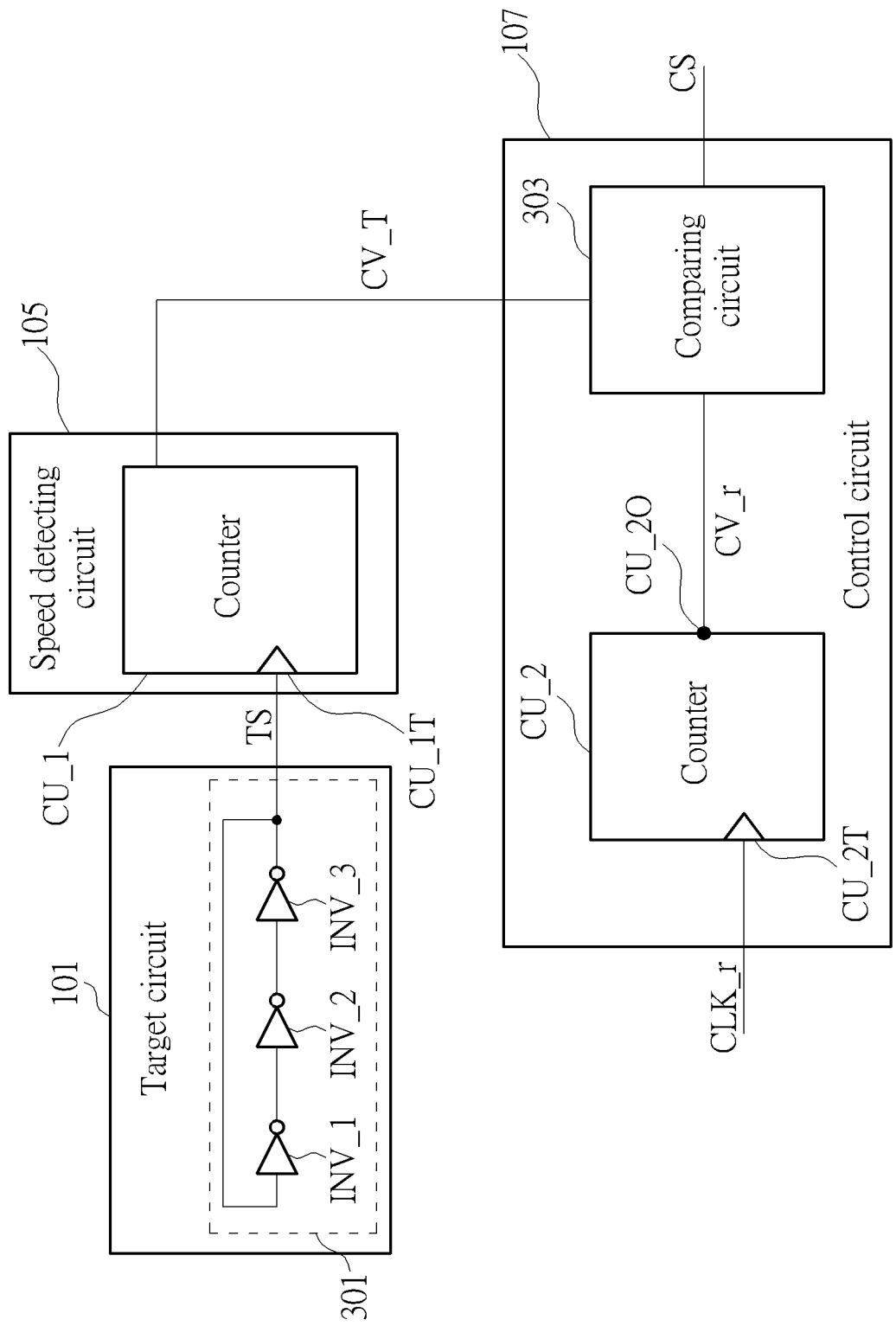
FIG. 3 is a more detailed circuit diagram of a voltage control circuit according to one embodiment of the present invention.

The speed detecting circuit 105 and the control circuit 107 can be implemented in various ways. FIG. 3 is a more detailed circuit diagram of a voltage control circuit according to one embodiment of the present invention. Please note, FIG. 3 omits some of the circuit details for the convenience of understanding. As shown in FIG. 3, the target circuit 101 has a ring oscillator 301 built therein, and the speed detecting circuit 105 comprises a counter CU_1. In other embodiments, the ring oscillator 301 is disposed in the speed detecting circuit 105. The ring oscillator 301 comprises an odd number of inverters or devices with similar function of inverter configured to generate a test signal TS. The inverters and the devices with similar function may be implemented by, for example but not limited to, a NOT gate, an NMOS inverter circuit, a PMOS inverter circuit, a CMOS (Complementary Metal-Oxide-Semiconductor) inverter circuit or a TTL (transistor-transistor logic) inverter circuit. The test signal TS is generated as an oscillating signal via the ring oscillator 301 and is related to the operating speed of the target circuit 101. In one embodiment, the faster the operating speed, the higher the frequency of the test signal TS is.

In this example, the ring oscillator 301 comprises three inverters INV_1, INV_2, and INV_3, but is not limited. The counter CU_1 comprises a clock terminal CU_1T and an output terminal CU_10. The clock terminal CU_1T receives the test signal TS to generate a to-be-measured count value CV_T at the output terminal CU_10. The control circuit 107 comprises a counter CU_2 including a clock terminal CU_2T and an output terminal CU_20. The clock terminal CU_2T receives a reference clock signal CLK_r to generate a reference count value CV_r at the output terminal CU_20. The reference count value CV_r may be a range of values having an upper limit of values and a lower limit of values. For example, in one embodiment, the reference count value CV_r has a value of 100 for a predetermined period of time, and the upper limit thereof is 110 and the lower limit thereof is 90.

In addition, the reference clock signal CLK_r is a clock signal with a fixed frequency, which may come from the target circuit 101, but may also come from other signal sources (e.g. an oscillator). The control circuit 107 further comprises a comparing circuit 303 (for example, a comparator) for generating the control signal CS according to the relation between the to-be-measured count value CV_T and the reference count value CV_r. In one embodiment, if the to-be-measured count value CV_T is larger than the upper limit of the value of the reference count value CV_r, it means the operating speed is too fast, so the operating voltage V_op is decreased to correspondingly reduce the operating speed. Conversely, if the to-be-measured count value CV_T is smaller than the lower limit of the value of the reference count value CV_r, it means the operating speed is too slow, thus the operating voltage V_op is pulled up to increase the operating speed correspondingly. Since the signal period of the test signal TS is related to the operating speed, the to-be-measured count value CV_T can represent the operating speed.

Figure 4:
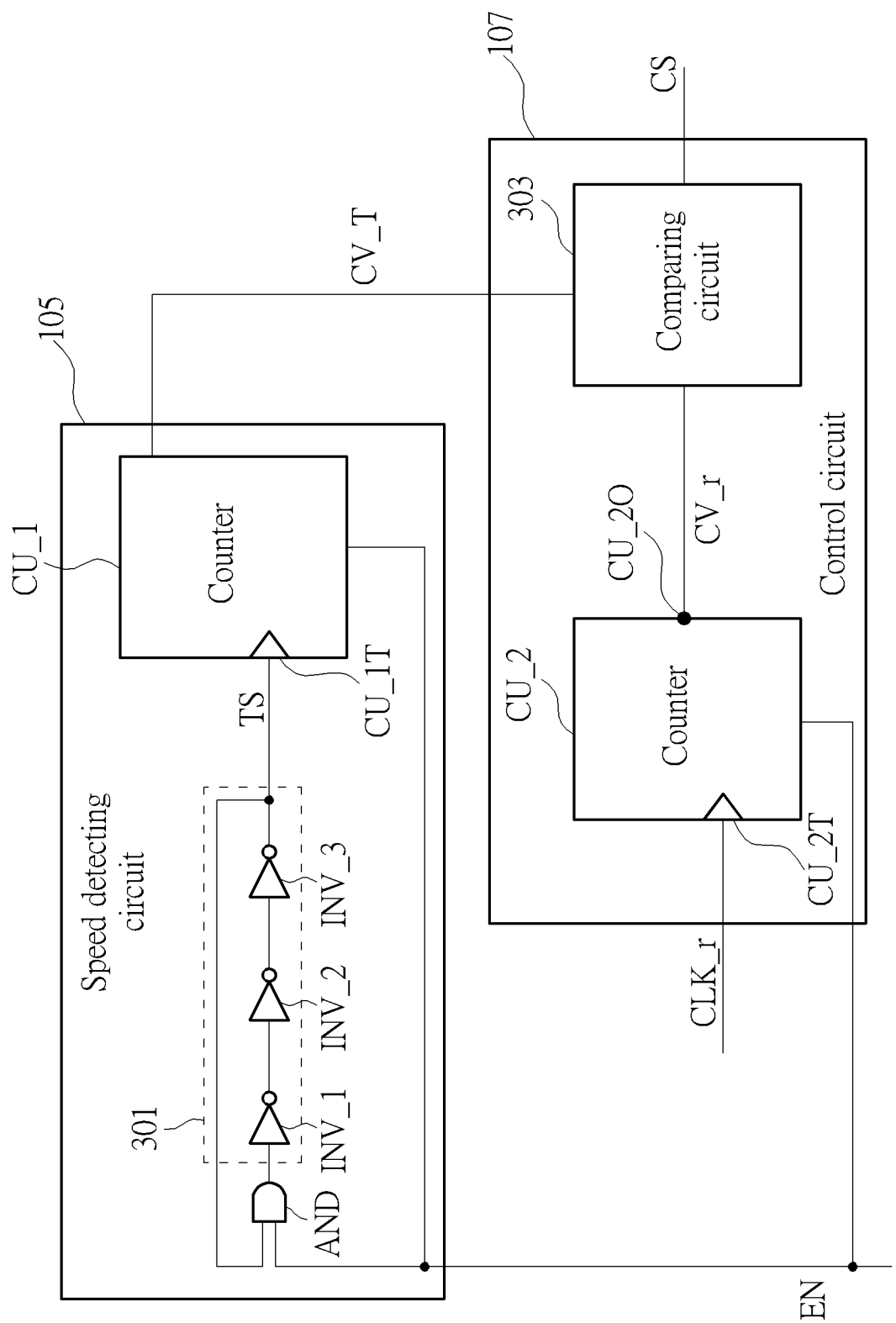
FIG. 4 is a more detailed circuit diagram of a voltage control circuit according to another embodiment of the present invention.

The circuit shown in FIG. 3 may further comprise other components. FIG. 4 is a more detailed circuit diagram of a voltage control circuit according to another embodiment of the present invention. In one embodiment, if the speed detecting circuit and the target circuit are in the same IC, the speed detecting circuit can detect the IC speed by itself, and the target circuit may not output the test signal TS to the speed detecting circuit. As shown in FIG. 4, the speed detecting circuit 105 and the target circuit (not shown) are in the same IC and the speed detecting circuit 105 comprises an AND gate, which comprises two input terminals and an output terminal. One input terminal is coupled to an output terminal of the last inverter (in this example, INV_3) of the ring oscillator 301. The other input terminal receives an enable signal EN, and the output terminal is coupled to an input terminal of the first inverter of the ring oscillator 301 (in this case, the inverter INV_1). The enable signal EN can be used to turn the ring oscillator 301 on or off. For example, when the enable signal is 1, the ring oscillator 301 is turned on, and when the enable signal is 0, the ring oscillator 301 is turned off, which saves power consumption. In one embodiment, the counter CU_1 and the counter CU_2 also receive the enable signal EN, so that they can be turned off together when the ring oscillator 301 is turned off, to further save power consumption.

It should be noted, however, the speed detecting circuit used in the present invention is not limited to the structure shown in FIG. 3 or FIG. 4, and any circuit that can achieve the same function should fall in the scope of the present invention. Moreover, the above-mentioned mechanism for adjusting the operating voltage can be used to adjust the IC before the IC is shipped from the factory. It can also be used by the IC to automatically adjust the operating voltage after the IC is shipped from the factory and actually used in the electronic device, so that the IC always has the best performance.

Figure 5:
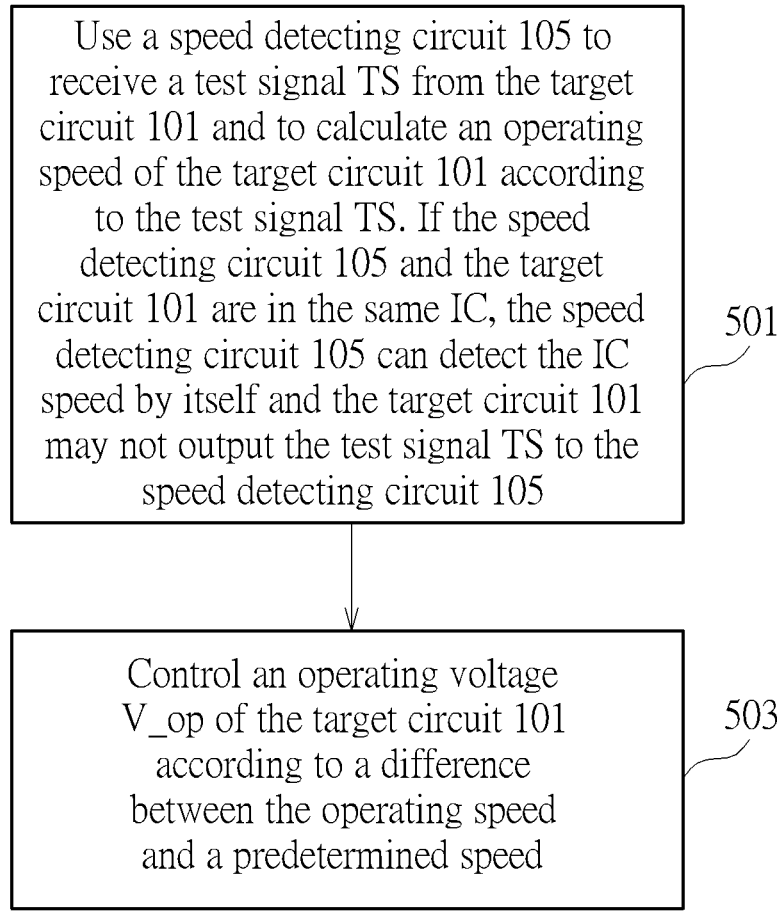
FIG. 5 illustrates a voltage control method according to one embodiment of the present invention.

In view of above-mentioned embodiments, the voltage control method illustrated in FIG. 5 can comprise followings steps:

Step 501

Use a speed detecting circuit 105 to receive a test signal TS from the target circuit 101 and to calculate an operating speed of the target circuit 101 according to the test signal TS. If the speed detecting circuit 105 and the target circuit 101 are in the same IC, the speed detecting circuit 105 can detect the IC speed by itself and the target circuit 101 may not output the test signal TS to the speed detecting circuit 105.

Step 503

Control an operating voltage V_op of the target circuit 101 according to a difference between the operating speed and a predetermined speed.

Other detail steps are disclosed in above-mentioned embodiments, thus are omitted for brevity here.

In view of above-mentioned embodiments, the operating voltage can be automatically adjusted to maintain the operating speed of the target circuit at a predetermined speed.

By this way, the issue for the prior art, that is, a too high operating voltage causes power consumption and a too low operating voltage affect the stability of the IC operation or yield can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage control circuit, for controlling an operating voltage of a target circuit, comprising:
    a speed detecting circuit, configured to detect an operating speed of the target circuit according to a frequency of a test signal from the target circuit; and
    a control circuit, coupled to the speed detecting circuit, configured to generate a voltage control signal according to a difference between the operating speed and a predetermined speed, to a power supply circuit which generates the operating voltage, to control the operating voltage.

2. The voltage control circuit of claim 1, wherein the speed detecting circuit and the target circuit are located in different ICs, and the speed detecting circuit receives the test signal related with the operating speed from the target circuit and calculates the operating speed according to the test signal.

3. The voltage control circuit of claim 1, wherein the speed detecting circuit, the control circuit and the target circuit are comprised in an IC, and the target circuit is an internal circuit of the IC.

4. The voltage control circuit of claim 3, wherein the power supply circuit is comprised in the IC.

5. The voltage control circuit of claim 3, wherein the power supply circuit is not comprised in the IC.

6. The voltage control circuit of claim 1, wherein the power supply circuit comprises at least one transistor, and the voltage control signal is an analog signal or a digital signal for controlling the transistor.

7. The voltage control circuit of claim 1,
    wherein the target circuit or the speed detecting circuit comprises a ring oscillator configured to generate an oscillating signal, and the ring oscillator comprises an odd number of inverters or devices which can perform functions of the inverters;
    wherein the speed detecting circuit comprises:
        a first counter, comprising a first clock terminal and a first output terminal, wherein the first clock terminal receives the oscillating signal to generate a to-be-measured count value at the first output terminal;
    wherein the control circuit is configured to generate the voltage control signal according to the to-be-measured count value and a reference count value representing the predetermined speed.

8. The voltage control circuit of claim 7, wherein the control circuit comprises:
    a second counter, comprising a second clock terminal and a second output terminal, wherein the second clock terminal receives a reference clock signal to generate the reference count value at the second output terminal.

9. The voltage control circuit of claim 8, wherein the ring oscillator is coupled to an AND gate which comprises a first input terminal, a second input terminal and an output terminal, wherein the first input terminal is coupled to an output terminal of a last inverter of the ring oscillator, the second input terminal receives an enable signal, and the output terminal is coupled to an input terminal of a first inverter of the ring oscillator.

10. The voltage control circuit of claim 9, wherein the first counter and the second counter receive the enable signal.

11. A voltage control method, for controlling an operating voltage of a target circuit, comprising:
    (a) using a speed detecting circuit to receive a test signal from the target circuit, and to calculate an operating speed of the target circuit according to a frequency of the test signal; and
    (b) generating a voltage control signal according to a difference between the operating speed and a predetermined speed, to a power supply circuit which generates the operating voltage, to control the operating voltage.

12. The voltage control method of claim 11, wherein the speed detecting circuit and the target circuit are comprised in the same IC, and the target circuit is an internal circuit of the IC.

13. The voltage control method of claim 12, wherein the power supply circuit is comprised in the IC.

14. The voltage control method of claim 12, wherein the power supply circuit is not comprised in the IC.

15. The voltage control method of claim 11, wherein the power supply circuit comprises at least one transistor, and the voltage control signal is an analog signal or a digital signal for controlling the transistor.

16. The voltage control method of claim 11, wherein the step (a) comprises:
    receiving the test signal to generate an oscillating signal;
    generating a to-be-measured count value according to the oscillating signal;
    generating the voltage control signal according to the to-be-measured count value and a reference count value representing the predetermined speed.

17. The voltage control method of claim 16, wherein the step (b) comprises:
    generating the reference count value according to a reference clock signal.

18. An IC capable of automatically adjusting an operating voltage, comprising:
    an internal circuit, receiving an operating voltage;

a speed detecting circuit, coupled to the internal circuit, configured to detect an operating speed of a target circuit according to a frequency of a test signal from the target circuit; and a control circuit, coupled to the speed detecting circuit, configured to generate a voltage control signal according to a difference between the operating speed and a predetermined speed, to a power supply circuit which generates the operating voltage, to control the operating voltage.

19. The IC of claim 18, wherein the target circuit or the speed detecting circuit comprises a ring oscillator configured to generate an oscillating signal, and the ring oscillator comprises an odd number of inverters which can perform functions of the inverters;

wherein the speed detecting circuit comprises:

a first counter, comprising a first clock terminal and a first output terminal, wherein the first clock terminal receives the oscillating signal to generate a to-be-measured count value at the first output terminal;

wherein the control circuit is configured to generate the voltage control signal according to the to-be-measured count value and a reference count value representing the predetermined speed.

* * * * *